United States Patent
Miyamoto

(10) Patent No.: US 10,515,683 B2
(45) Date of Patent: Dec. 24, 2019

(54) SEMICONDUCTOR DEVICE PROVIDING AN OUTPUT IN RESPONSE TO A READ COMMAND OR A MODE-REGISTER READ COMMAND

(71) Applicant: MICRON TECHNOLOGY, INC., Boise, ID (US)

(72) Inventor: Takayuki Miyamoto, Machida (JP)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 15/882,607

(22) Filed: Jan. 29, 2018

(65) Prior Publication Data
US 2019/0237126 A1 Aug. 1, 2019

(51) Int. Cl.
*G11C 11/4076* (2006.01)
*G11C 11/4096* (2006.01)

(52) U.S. Cl.
CPC ...... *G11C 11/4076* (2013.01); *G11C 11/4096* (2013.01)

(58) Field of Classification Search
CPC .............. G11C 11/4076; G11C 7/1045; G11C 11/4096; G11C 7/222; G11C 7/1072; G11C 7/22; G11C 7/1069
See application file for complete search history.

(56) References Cited

U.S. PATENT DOCUMENTS 8,923,077 B2* 12/2014 Sato ...................... G11C 7/1057
326/63
2010/0195413 A1* 8/2010 Shimizu ............... G11C 7/1045
365/189.05

* cited by examiner

*Primary Examiner* — David Lam
(74) *Attorney, Agent, or Firm* — Dorsey & Whitney LLP

(57) ABSTRACT

Disclosed herein is an apparatus that includes a first circuit that activates first and second timing signals in response to a first command and activates the second timing signal in response to a second command, a second circuit that amplifies a first data read out from a first memory area in response to the first command in synchronization with the first timing signal, and a third circuit that outputs one of the first data output from the second circuit and a second data read out from a second memory area in response to the second command, in synchronization with the second timing signal.

13 Claims, 9 Drawing Sheets

US 10,515,683 B2

SEMICONDUCTOR DEVICE PROVIDING AN OUTPUT IN RESPONSE TO A READ COMMAND OR A MODE-REGISTER READ COMMAND

BACKGROUND

A semiconductor device, such as a DRAM (Dynamic Random Access Memory), sometimes includes a mode register in which a setting parameter is stored. The setting parameter stored in the mode register can be read out to outside by issuing a mode-register read command.

However, a transmission path of the setting parameter read out in response to the mode-register read command is different from a transmission path of user data read out in response to a read command. Therefore, it is not always easy to match an output timing of the user data output to outside in response to the read command and an output timing of the setting parameter output to outside in response to the mode-register read command with each other.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
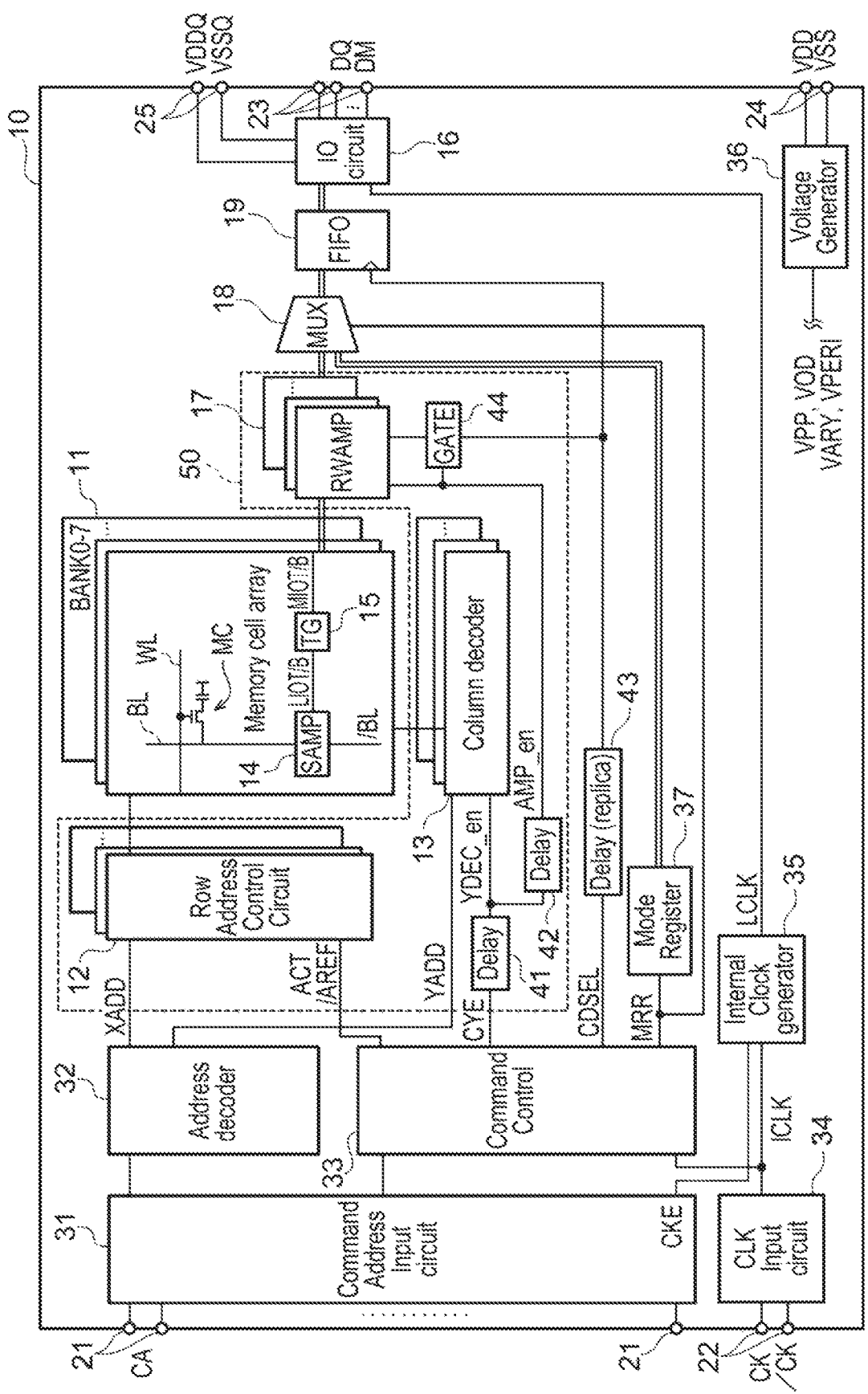
FIG. 1 is a block diagram of a semiconductor device according to an embodiment of the present disclosure.

FIG. 1 is a block diagram of the semiconductor device according to an embodiment of the present disclosure. A semiconductor device 10 may be an LPDDR4 SDRAM incorporated in a single semiconductor chip, for example. The semiconductor device 10 may be mounted on an external board, such as a memory module board or a mother board. As illustrated in FIG. 1, the semiconductor device 10 includes a memory cell array 11. The memory cell array 11 includes a plurality of word lines WL, a plurality of bit lines BL, and a plurality of memory cells MC arranged at interactions of the word lines WL and the bit lines BL. Selection of a word line WL is performed by a row address control circuit 12, and selection of a bit line BL is performed by a column decoder 13. A sense amplifier 14 is connected to a corresponding bit line BL and a pair of local I/O lines LIOT/B. The pair of local I/O lines LIOT/B is connected to a pair of main I/O lines MIOT/B via a transfer gate 15 that functions as a switch.

A plurality of external terminals are provided in the semiconductor device 10. The external terminals include command address terminals 21, clock terminals 22, data terminals 23, and power-supply terminals 24 and 25. The data terminals 23 are connected to an I/O circuit 16.

The command address terminals 21 are supplied with a command address signal CA. A portion of the command address signal CA which relates to an address is transferred to an address decoder 32 via a command address input circuit 31. Another portion that relates to a command is transferred to a command control circuit 33 via the command address input circuit 31. The address decoder 32 decodes an address signal and generates a row address XADD and a column address YADD. The row address XADD is supplied to the row address control circuit 12, and the column address YADD is supplied to the column decoder 13. Further, a clock enable signal CKE of the command address signal CA is supplied to an internal clock generator 35.

The clock terminals 22 are supplied with complementary external clock signals CK and /CK. The complementary external clock signals CK and /CK are supplied to a clock input circuit 34. The clock input circuit 34 generates an internal clock signal ICLK based on the complementary external clock signals CK and /CK. The internal clock signal ICLK is supplied to at least the command control circuit 33 and the internal clock generator 35. The internal clock generator 35 is activated by the clock enable signal CKE, for example, and generates an internal clock signal LCLK based on the internal clock signal ICLK. The internal clock signal LCLK is supplied to the I/O circuit 16. The internal clock signal LCLK is used as a timing signal that defines a timing at which read data DQ (or a setting parameter) is output from the data terminal 23 at the time of a read operation and a mode-register read operation. In a write operation, write data is input to the data terminal 23 from outside. In the write operation, a data mask signal DM may be input to the data terminal 23 from outside.

The power-supply terminals 24 are supplied with power-supply potentials VDD and VSS. These power-supply potentials VDD and VSS are supplied to a voltage generator 36. The voltage generator 36 generates various internal potentials VPP, VOD, VARY, and VPERI, for example, based on the power-supply potentials VDD and VSS. The internal potential VPP is used mainly in the row address control circuit 12. The internal potentials VOD and VARY are used mainly in the sense amplifier 14 included in the memory cell array 11. The internal potential VPERI is used in many other circuit blocks.

Power-supply potentials VDDQ and VSSQ are supplied to the I/O circuit 16 from the power-supply terminals 25. Although the power-supply potentials VDDQ and VSSQ may be the same potentials as the power-supply potentials VDD and VSS supplied to the power supply terminals 24, respectively, dedicated power-supply potentials VDDQ and VSSQ are assigned to the I/O circuit 16 in order to prevent propagation of power-supply noise generated in the I/O circuit 16 to another circuit block.

The semiconductor device 10 further includes a mode register 37. Various setting parameters for the semiconductor device 10 are stored in the mode register 37. The contents of the setting parameters can be rewritten by issuing a mode-register set command, and can be read out to outside by issuing a mode-register read command.

When the mode-register read command is issued, the command control circuit 33 activates an internal timing signal CDSEL and an internal selection signal MRR. When the selection signal MRR is activated, the setting parameter is output from the mode register 37. The selection signal MRR may control a multiplexer 18. The multiplexer 18 selects the setting parameter read out from the mode register 37 when the selection signal MRR is in an active state (for example, at a high level), and selects read data that is read out from the memory cell array 11 and is amplified by a read/write amplifier 17, when the selection signal MRR is in an inactive state (for example, at a low level). An output of the multiplexer 18 is supplied to a FIFO circuit 19. The FIFO circuit 19 transfers the read data or the setting parameter output from the multiplexer 18 to the I/O circuit 16 in synchronization with the timing signal CDSEL delayed by a delay circuit 43. The delay circuit 43 is a replica circuit that has substantially the same delay time as an operation delay of the column decoder 13 and the read/write amplifier 17. A part of the delay time may be a wiring delay.

When a read command is issued, the command control circuit 33 activates an internal timing signal CYE and the internal timing signal CDSEL. An activation timing of the timing signal CYE and that of the timing signal CDSEL may be the same. Meanwhile, when the read command is issued, the selection signal MRR is kept at an inactive state. The timing signal CYE is activated when the read command or a write command is issued, and is kept at an inactive state when the mode-register read command is issued. The timing signal CYE is supplied to a delay circuit 41. The delay circuit 41 generates an internal enable signal YDEC_en by delaying the timing signal CYE. The enable signal YDEC_en is used as a timing signal that defines an operation timing of the column decoder 13. Further, the enable signal YDEC_en is also supplied to another delay circuit 42. The delay circuit 42 generates an internal enable signal AMP_en by delaying the enable signal YDEC_en. The enable signal AMP_en is used as a timing signal that defines a start timing of an amplification operation by the read/write amplifier 17. In the example illustrated in FIG. 1, the enable signal AMP_en is generated based on the enable signal YDEC_en. However, the enable signal AMP_en may be generated based on the timing signal CYE and increasing a delay amount of the delay circuit 42.

The timing signal CDSEL delayed by the delay circuit 43 is also supplied to the read/write amplifier 17. The read/write amplifier 17 outputs the read data to the multiplexer 18 in synchronization with the delayed timing signal CDSEL. However, in a case where the enable signal AMP_en is not activated, for example, when the mode-register read command is issued, the timing signal CDSEL is blocked by a gate circuit 44. Therefore, when the mode-register read command is issued, an output operation by the read/write amplifier 17 is not performed.

Figure 2A:
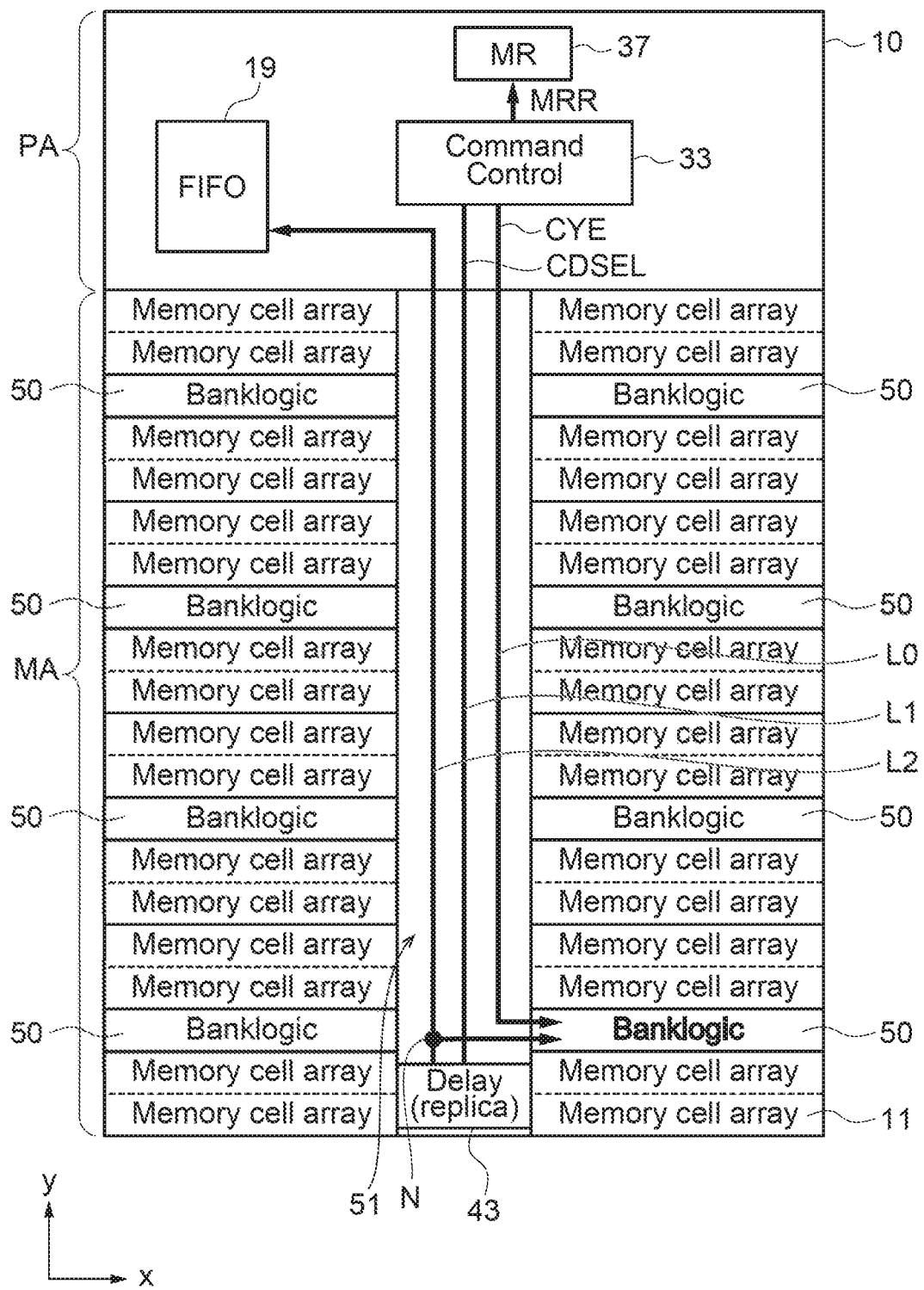
FIG. 2A is a schematic plan view for explaining a layout of signal lines transmitting timing signals and a delay circuit.
Figure 2B:
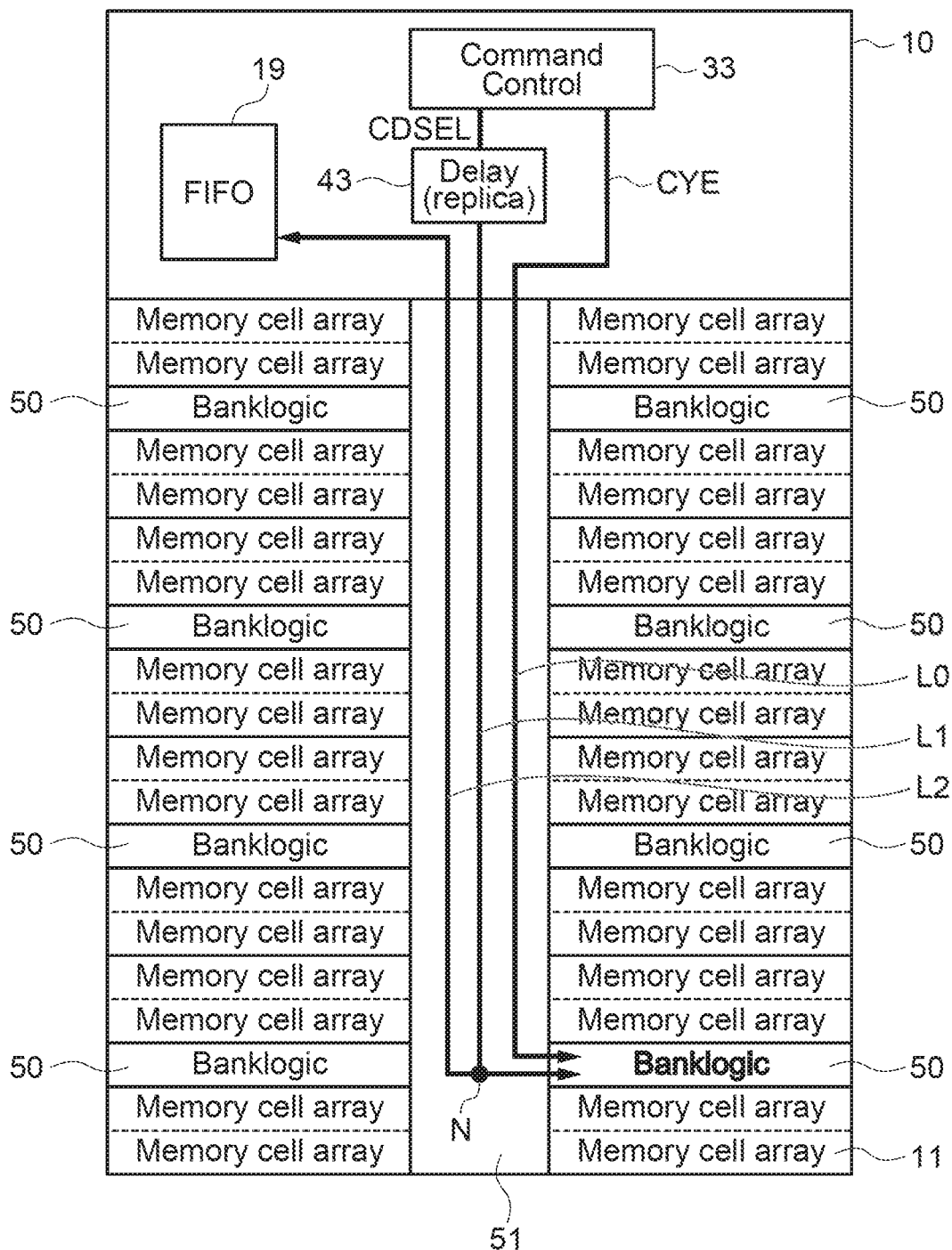
FIG. 2B is a schematic plan view for explaining a layout of the delay circuit according to a first modification.
Figure 2C:
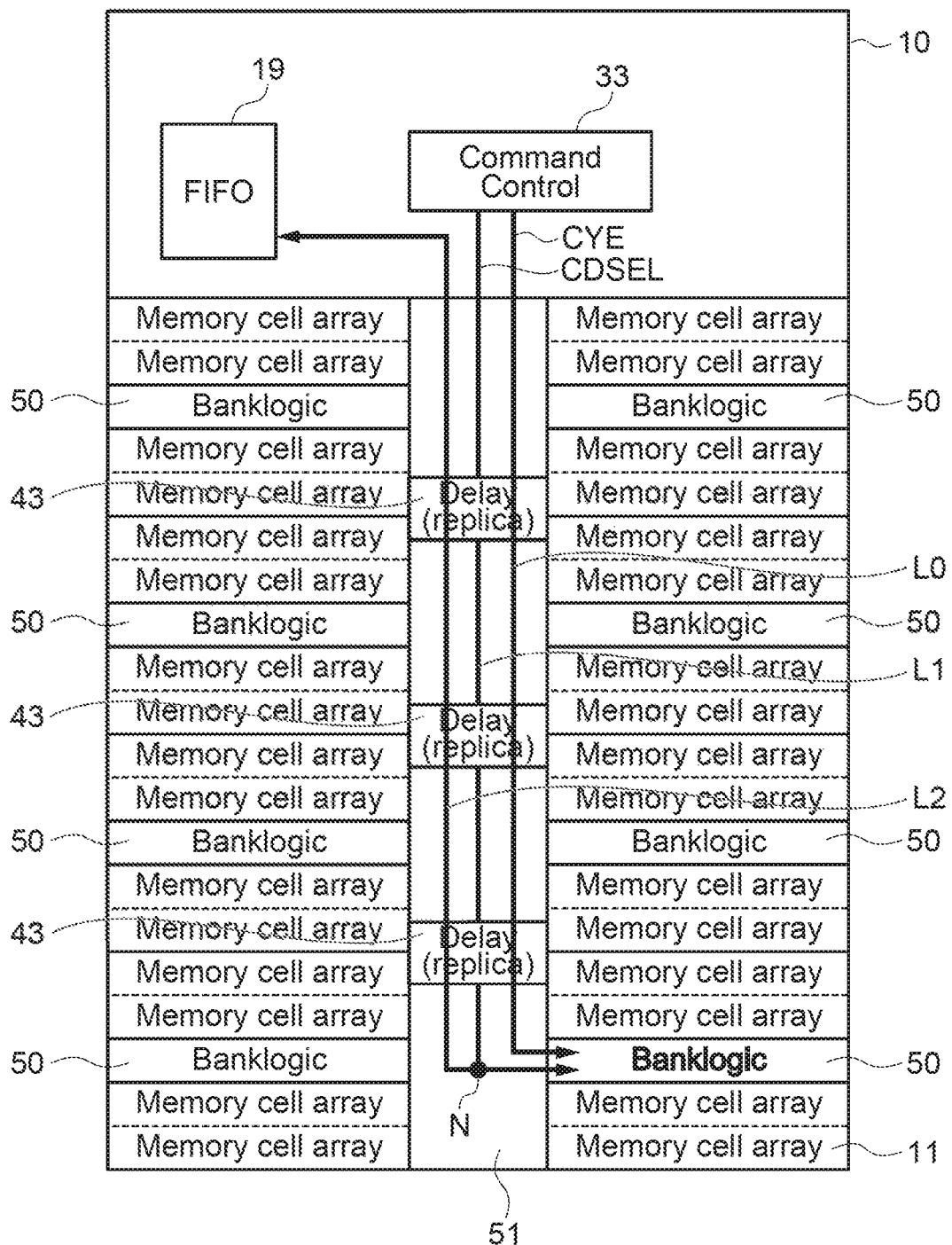
FIG. 2C is a schematic plan view for explaining a layout of the delay circuit according to a second modification.

As illustrated in FIG. 2A, the semiconductor device 10 includes a memory area MA and a peripheral circuit area PA. The memory cell array 11, a bank logic circuit 50, and a wiring area 51 are arranged in the memory area MA. Most other circuits, for example, the command control circuit 33, the mode register 37 and the FIFO circuit 19 are arranged in the peripheral circuit area PA. The bank logic circuit 50 is a circuit block including the row address control circuit 12, the column decoder 13, the read/write amplifier 17, and the delay circuits 41 and 42 illustrated in FIG. 1. The wiring area 51 is an area sandwiched between two memory cell arrays 11 in an x-direction. A plurality of signal lines L0 to L2 that extend in a y-direction along the memory cell array 11 are arranged in the wiring area 51. In the example illustrated in FIG. 2A, the delay circuit 43 is arranged at a far-end portion in the y-direction of the wiring area 51. However, the delay circuit 43 may be arranged in the peripheral circuit area PA as illustrated in FIG. 2B, or a plurality of delay circuits 43 may be arranged in the wiring area 51 in a distributed manner as illustrated in FIG. 2C.

The signal line L0 is a line for transmitting the timing signal CYE. The signal lines L1 and L2 are lines for transmitting the timing signal CDSEL. A portion or the whole of the delay circuit 41 may be formed by a wiring delay of the signal line L0. The signal line L1 is a section from the command control circuit 33 to a connection node N. The signal line L2 is a section from the connection node N to the FIFO circuit 19. The connection node N is a portion that is connected to the read/write amplifier 17 included in the bank logic circuit 50. As illustrated in FIG. 2A, the delay circuit 43 is inserted into the signal line L1. A portion of the delay circuit 43 may be formed by wiring delays of the signal lines L1 and L2.

Figure 3:
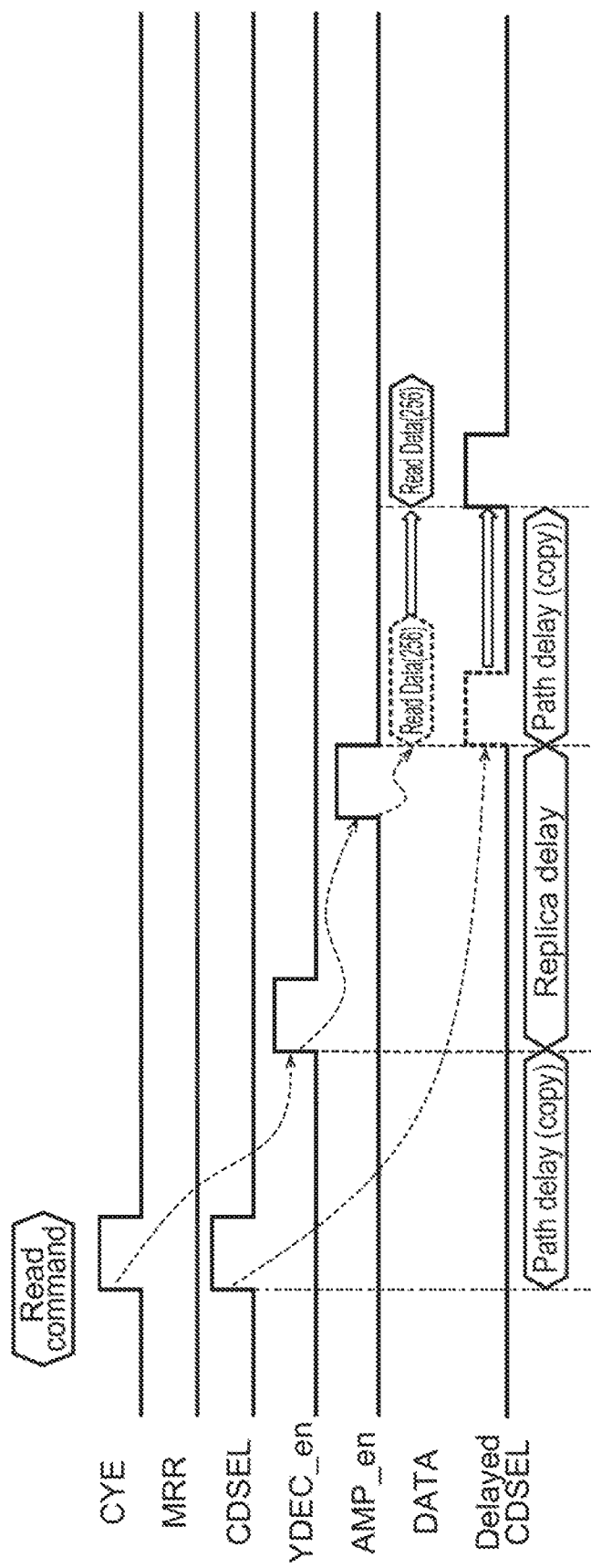
FIG. 3 is a timing chart for explaining an operation when a read command is issued.

FIG. 3 is a timing chart for explaining an operation when a read command is issued.

As illustrated in FIG. 3, when a read command is issued, the liming signals CYE and CDSEL are activated at approximately the same time in response to the read command. The timing signal CYE is delayed by the delay circuits 41 and 42, so that the enable signals YDEC_en and AMP_en are generated. Accordingly, the column decoder 13 and the read/write amplifier 17 are sequentially activated, and read data read out from the memory cell array 11 is amplified by the read/write amplifier 17. Further, the timing signal CDSEL delayed by the delay circuit 43 is supplied to the read/write amplifier 17, and in response to this signal, the read data is output from the read/write amplifier 17.

Figure 2D:
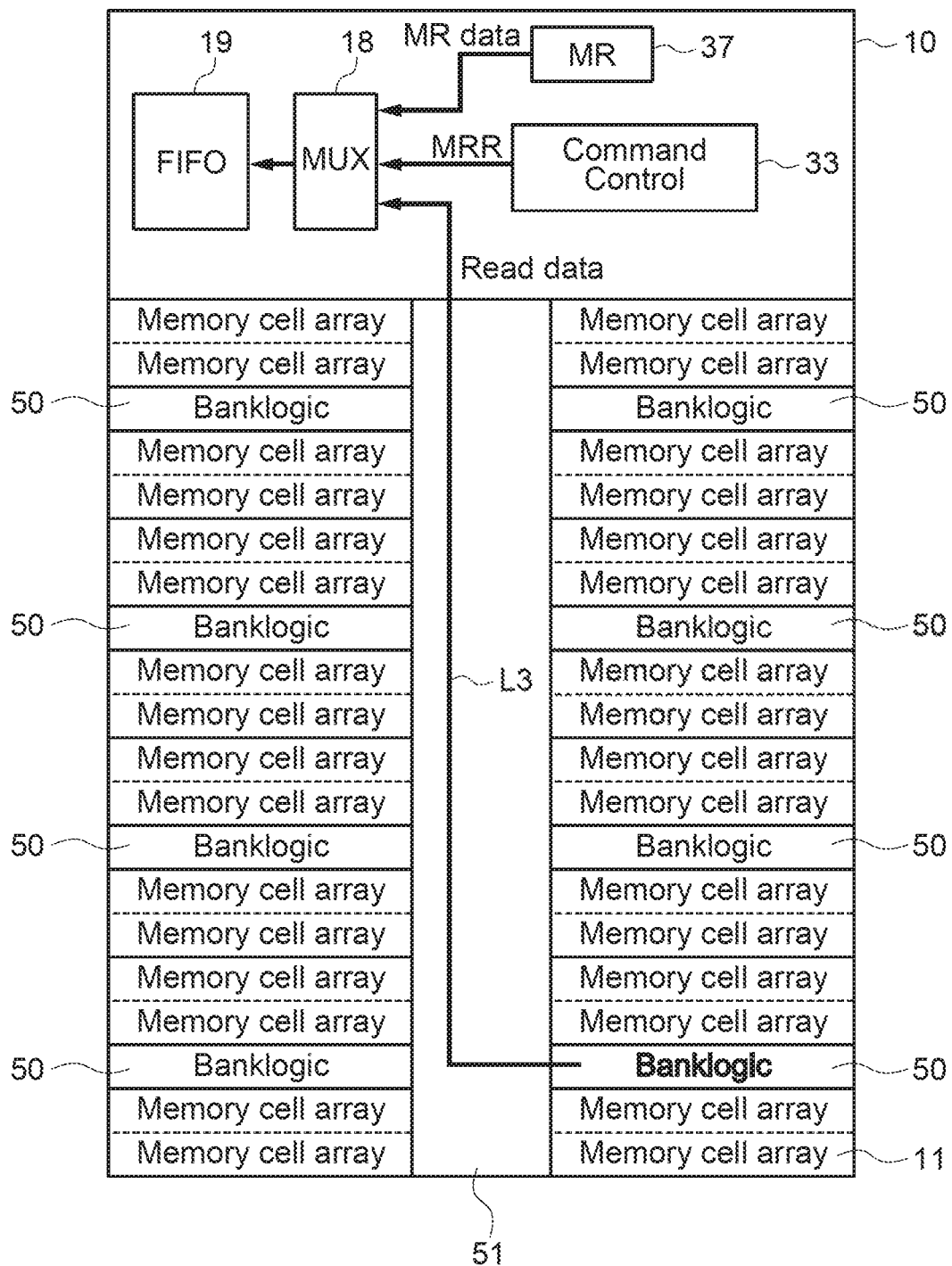
FIG. 2D is a schematic plan view for explaining a layout of signal lines transmitting read data.

In the example illustrated in FIG. 3, the delay circuit 41 is formed by a wiring delay of the signal line L0. In this case, when the timing signals CYE and CDSEL are activated at approximately the same time, the timing signal CDSEL is input to the delay circuit 43 at a timing at which the enable signal YDEC_en is input to the column decoder 13. This is because the line length of the signal line L0 and that of the signal line L1 are approximately the same as each other, as illustrated in FIG. 2A. Because the delay circuit 43 has the same delay time as an operation delay of the column decoder 13 and the read/write amplifier 17 as described above, the timing signal CDSEL input to the read/write amplifier 17 is activated immediately after completion of an amplification operation by the read/write amplifier 17. Therefore, 256-bit read data, for example, is transferred front the read/write amplifier 17 to a data bus L3 illustrated in FIG. 2D, as illustrated with a broken line in FIG. 3. As illustrated in FIG. 2D, the data bus L3 extends in the y-direction along the memory cell array 11, and has approximately the same line length as the signal line L2.

The read data transferred to the data bus L3 is supplied to the FIFO circuit 19 via the multiplexer 18. Here, a delay time caused by the data bus L3 is generated from transfer of the read data to the data bus L3 until the read data reaches the FIFO circuit 19. 256-bit read data, for example, illustrated with a solid line in FIG. 3, is read data that has reached the FIFO circuit 19. Further, the timing signal CDSEL delayed by the delay circuit 43 is supplied to the FIFO circuit 19 via the signal line L2. Because the signal line L2 and the data bus L3 have approximately the same line lengths, the timing signal CDSEL is supplied to the FIFO circuit 19 at a timing at which the read data reaches the FIFO circuit 19. When the timing signal CDSEL is supplied to the FIFO circuit 19, the read data is transferred to the I/O circuit 16, and is output to outside via the data terminal 23.

Figure 4:
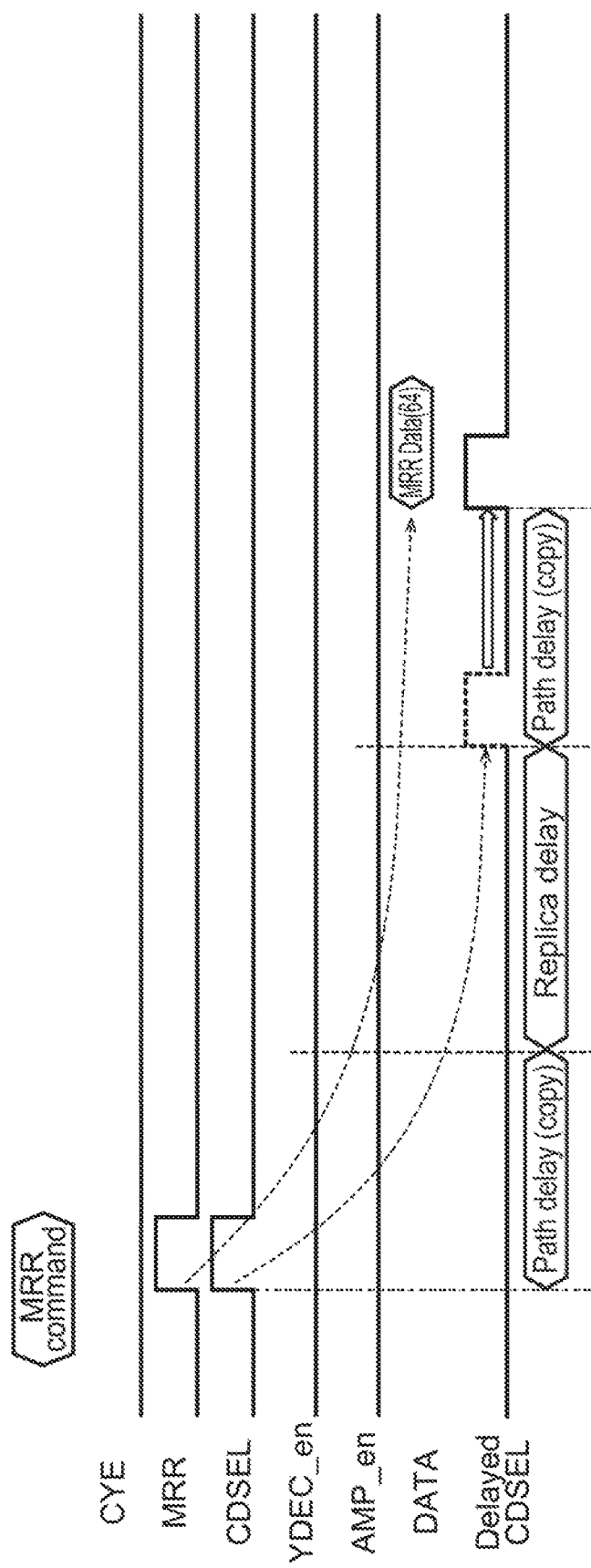
FIG. 4 is a timing chart for explaining an operation when a mode-register read command is issued.

FIG. 4 is a timing chart for explaining an operation when a mode-register read command is issued.

As illustrated in FIG. 4, when a mode-register read command is issued, the timing signal CDSEL and the selection signal MRR are activated in response to this command. At this time, the timing signal CYE is not activated. When the selection signal MRR is activated, a 64-bit setting parameter, for example, retained in the mode register 37 is read out and is supplied to the FIFO circuit 19 via the multiplexer 18. While a timing of outputting the setting parameter from the FIFO circuit 19 is defined by the timing signal CDSEL, a generation timing of the timing signal CDSEL and a transmission path are the same as those when a read command is issued. That is, the timing signal CDSEL is supplied to the FIFO circuit 19 via the signal line L1, the delay circuit 43, and the signal line L2, and a delay time during this supply is the same as that when the read command is issued. Therefore, the FIFO circuit 19 transfers the setting parameter to the I/O circuit 16 at the same timing as a transfer timing in a read operation. Accordingly, the setting parameter is output to outside via the data terminal 23 at the same timing as an output timing in the read operation.

As described above, in tire semiconductor device 10 according to the present embodiment, a timing at which the timing signal CDSEL is supplied to the FIFO circuit 19 in a read operation is the same as in a mode-register read operation. Therefore, it is possible to match an output timing of read data in response to a read command and an output timing of a setting parameter in response to a mode-register read command with each other. Further, the timing signal CYE is not activated when the mode-register read command is issued. Therefore, generation of unnecessary consumption current is also prevented.

Figure 5:
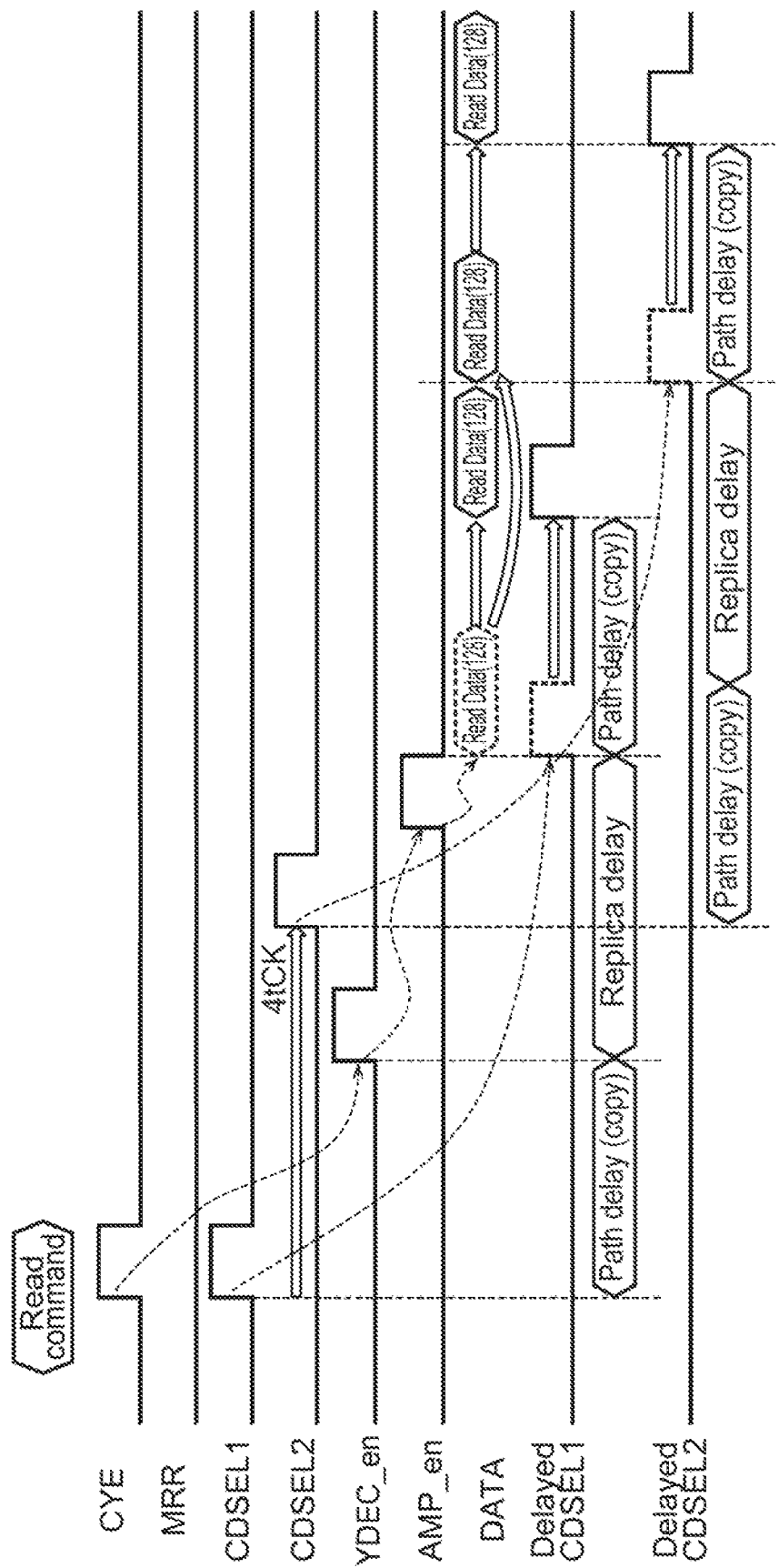
FIG. 5 is a timing chart for explaining an operation when a read command is issued.
Figure 6:
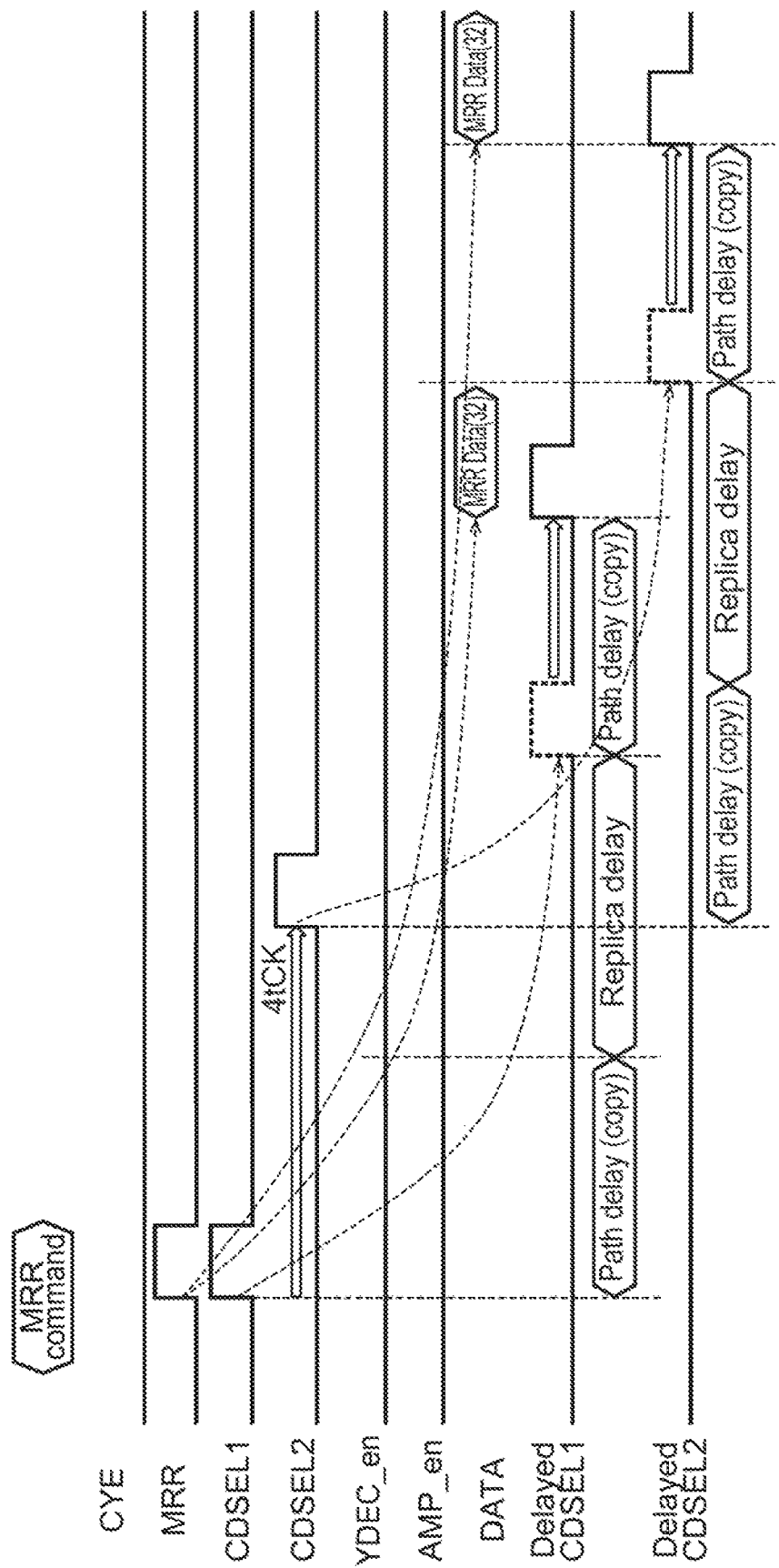
FIG. 6 is another timing chart for explaining an operation when a mode-register read command is issued.

Transfer of read data from the read/write amplifier 17 to the FIFO circuit 19 can be performed a plurality of times in a time-division manner. In the example illustrated in FIG. 5, a timing signal CDSEL1 and a timing signal CDSEL2 are sequentially activated with a time difference of four clock cycles therebetween, for example. In response to the timing signal CDSEL1, first-half 128-bit read data is transferred to the data bus L3. In response to the tuning signal CDSEL2, second-half 128-bit read data is transferred to the data bus L3. The FIFO circuit 19 sequentially transfers the read data to the I/O circuit 16 in response to the timing signals CDSEL1 and CDSEL2. With this method, it is possible to reduce the number of the data buses L3 to a half. In this case, it suffices that, when a mode-register read command is issued, a first-half 32-bit setting parameter is transferred from the FIFO circuit 19 to the I/O circuit 16 in response to the timing signal CDSEL1, and a second-half 32-bit setting parameter is transferred from the FIFO circuit 19 to the I/O circuit 16 in response to the timing signal CDSEL2, as illustrated in FIG. 6.

As described above, in a case of transferring read data by using the data bus L3 a plurality of times in a time-division manner, by outputting the setting parameter from the mode register 37 a plurality of times in a time-division manner also in a mode-register read operation, it is possible to output the setting parameter to outside at the same timing as an output timing in a read operation.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a first circuit that activates first and second timing signals in response to a first command and activates the second timing signal in response to a second command;
a second circuit that amplifies, in synchronization with the first timing signal, a first data read out from a first memory area in response to the first command;
a third circuit that outputs, in synchronization with the second timing signal, one of the first data output from the second circuit and a second data read out from a second memory area in response to the second command; and
a first delay circuit that delays the first timing signal,
wherein the second circuit amplifies the first data in synchronization with the first timing signal delayed by the first delay circuit.

2. The apparatus of claim 1, wherein the first circuit activates the second timing signal without activating the first timing signal in response to the second command.

3. An apparatus comprising:
a first circuit that activates first and second timing signals in response to a first command and activates the second timing signal in response to a second command;
a second circuit that amplifies, in synchronization with the first timing signal, a first data read out from a first memory area in response to the first command;
a third circuit that outputs, in synchronization with the second timing signal, one of the first data output from the second circuit and a second data read out from a second memory area in response to the second command; and
a second delay circuit that delays the second timing signal,
wherein the third circuit outputs one of the first and second data in synchronization with the second timing signal delayed by the second delay circuit.

4. The apparatus of claim 3, further comprising a signal line for transmitting the second timing signal,
wherein the signal line includes a connection node connected to the second circuit, a first line section that connects the first circuit to the connection node, and a second line section that connects the connection node to the third circuit, and wherein the second circuit outputs the first data to the third circuit in synchronization with the second timing signal supplied from the connection node.

5. The apparatus of claim 4, wherein the first line section and the second line section include portions that extend in parallel to and along each other.

6. The apparatus of claim 5, wherein the first line section and the second line section include portions that extend in parallel to each other along the first memory area.

7. The apparatus of claim 6, wherein the first memory area is a memory cell array.

8. The apparatus of claim 7, wherein the first command is a read command.

9. The apparatus of claim 7,
wherein the memory cell array and the second circuit are arranged in a cell array area, and
wherein the first and third circuits are arranged in a peripheral circuit area located outside the cell array area.

10. The apparatus of claim 9, further comprising another signal line for transmitting the first timing signal from the first circuit to the second circuit,
wherein the first line section and the another signal line include portions that extend in parallel to each other along the first memory area.

11. The apparatus of claim 9, wherein the second memory area is a mode register arranged in the peripheral circuit area.

12. The apparatus of claim 11, wherein the second command is a mode-register read command.

13. The apparatus of claim 1, further comprising a multiplexer that receives the first and second data,
wherein the first circuit brings a selection signal in a first logic level in response to the first command, and brings the selection signal in a second logic level in response to the second command, and
wherein the multiplexer supplies the first data to the third circuit when the selection signal is in the first logic level, and supplies the second data to the third circuit when the selection signal is in the second logic level.

* * * * *